(12) United States Patent
Tanaka et al.

(10) Patent No.: US 11,140,788 B2
(45) Date of Patent: Oct. 5, 2021

(54) COMPONENT MOUNTING METHOD, COMPONENT MOUNTING SYSTEM, AND MANUFACTURING METHOD OF COMPONENT MOUNTING BOARD

(71) Applicant: Panasonic Intellectual Property Management Co., Ltd., Osaka (JP)

(72) Inventors: Tetsuya Tanaka, Fukuoka (JP); Masahiko Akasaka, Fukuoka (JP); Koji Sakurai, Fukuoka (JP); Toshihiko Nagaya, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 284 days.

(21) Appl. No.: 16/268,519

(22) Filed: Feb. 6, 2019

(65) Prior Publication Data
US 2019/0254174 A1    Aug. 15, 2019

(30) Foreign Application Priority Data
Feb. 14, 2018    (JP) ............................. JP2018-023625

(51) Int. Cl.
*H01R 9/00*    (2006.01)
*H05K 3/02*    (2006.01)
(Continued)

(52) U.S. Cl.
CPC ......... *H05K 3/3447* (2013.01); *B23K 1/0016* (2013.01); *B23K 1/203* (2013.01); *H05K 3/3485* (2020.08); *H05K 3/3489* (2013.01); *H05K 13/0409* (2018.08); *H05K 13/0465* (2013.01); *H05K 13/0469* (2013.01);
(Continued)

(58) Field of Classification Search
CPC .... B23K 1/0016; B23K 1/203; B23K 3/0638; B23K 2101/42; H05K 3/1233; H05K 3/3447; H05K 3/3485; H05K 3/3489; H05K 13/0409; H05K 13/0465; H05K 13/0469; H05K 2203/0126; H05K 2203/0139
See application file for complete search history.

(56) References Cited

U.S. PATENT DOCUMENTS 5,676,305 A * 10/1997 Potter ................... H02G 3/0487
228/207
6,013,899 A * 1/2000 Eguchi ................. B23K 3/0623
219/388

(Continued)

FOREIGN PATENT DOCUMENTS

| JP | 61279357 A | * | 12/1986 |
| JP | 63317259 A | * | 12/1988 |
| JP | 2016-025220 | | 2/2016 |

*Primary Examiner* — Paul D Kim
(74) *Attorney, Agent, or Firm* — Pearne & Gordon LLP

(57) ABSTRACT

In component mounting for mounting a pin connecting component having a pin on a board having a through-hole electrode, a solder paste is printed on the through-hole electrode through a screen mask having an opening corresponding to the through-hole electrode, a flux is transferred onto the pin by holding the pin connecting component and immersing the pin into a flux tank filled with the flux, and the pin onto which the flux is transferred is inserted into the through-hole electrode on which the solder paste is printed to mount the pin connecting component on the board.

9 Claims, 11 Drawing Sheets

(51) Int. Cl.
  *H05K 3/34*   (2006.01)
  *B23K 1/00*   (2006.01)
  *B23K 1/20*   (2006.01)
  *H05K 13/04*  (2006.01)
  *B23K 101/42* (2006.01)

(52) U.S. Cl.
  CPC .. *B23K 2101/42* (2018.08); *H05K 2203/0126* (2013.01); *H05K 2203/0139* (2013.01)

(56) References Cited

U.S. PATENT DOCUMENTS 8,146,793 B2 * 4/2012 Ng ............... B23K 1/203
                                              228/52
9,263,414 B2 * 2/2016 Yeo ............... H01L 24/75

\* cited by examiner

COMPONENT MOUNTING METHOD, COMPONENT MOUNTING SYSTEM, AND MANUFACTURING METHOD OF COMPONENT MOUNTING BOARD

BACKGROUND

1. Technical Field

The present disclosure relates to a component mounting method for mounting a component on a board having a through-hole electrode, a component mounting system, and a manufacturing method of a component mounting board.

2. Description of the Related Art

In a case where an objective component is mounted on a board via a pin terminal as a connection terminal such as a connector as a form of mounting a component, a so-called through-hole electrode is provided on the board in which an electrode for solder bonding by inserting the pin terminal is penetrated through the board. In component mounting targeting such a through-hole electrode, after supplying a solder paste to the through-hole electrode by screen printing, the pin terminal is inserted into the through-hole electrode and bonded with the solder (for example, Japanese Patent Unexamined Publication No. 2016-25220).

In Japanese Patent Unexamined Publication No. 2016-25220, a portion of the solder paste filled in the through-hole electrode is pushed out by the inserted pin terminal. At this time, the pushed out solder paste may be attached to a tip end of the pin terminal and separated from the solder paste in the through-hole electrode in some cases. Even in such a case, when the solder paste is melt by reflowing, the solder paste attached to the tip end of the insertion pin terminal is applied upward along the pin terminal, and is integrated with the solder in the through-hole electrode to form a solder bond.

SUMMARY

In recent years, the application of mounting boards on which components are mounted and the quality requirements required for these mounting boards are diversified. Among these mounting boards, high reliability is required for the mounting board used for on-vehicle electronic equipment. In a case where this type of mounting board includes the above-described through-hole electrode, it is important to improve the bonding reliability of the solder bond for bonding the pin terminal inserted into the through-hole electrode. The solder supplied for the solder bonding is supplied in a solder paste form. However, since the area of the solder paste becomes around the half of the area when the solder paste melts, it is necessary to supply a sufficient amount of the solder paste with respect to the through-hole electrode in order to improve the bonding reliability. Specifically, an amount sufficient enough to fill the inside of the through-hole electrode is not sufficient for the required supply amount. It is desirable to fill the solder paste in such a format that the solder paste protrudes from the bottom end of the through-hole electrode.

An object of the disclosure is to provide a component mounting method and a component mounting system capable of stably mounting a component on a board having a through-hole electrode with high reliability.

A component mounting method according to the disclosure for mounting a component having a pin terminal on a board having a through-hole electrode, the method including: printing a solder paste on the through-hole electrode through a mask having an opening corresponding to the through-hole electrode; transferring a flux onto the pin terminal by holding the component and immersing the pin terminal into a flux tank filled with the flux; and mounting the component on the board by inserting the pin terminal onto which the flux is transferred into the through-hole electrode on which the solder paste is printed.

A component mounting system for mounting a component having a pin terminal on a board having a through-hole electrode according to the disclosure, the system including: a printer that prints a solder paste on the through-hole electrode through a mask having an opening corresponding to the through-hole electrode; and a component mounter that has a mounting head which holds the component and mounts the component on the board and a flux tank which is filled with a flux, in which the mounting head transfers the flux onto the pin terminal by immersing the pin terminal in the flux tank, and inserts the pin terminal onto which the flux is transferred into the through-hole electrode on which the solder paste is printed.

According to the disclosure, it is possible to stably mount a component on a board having a through-hole electrode with high reliability.

DETAILED DESCRIPTION

Prior to describing exemplary embodiments of the disclosure, the problems in the devices of the related art will be briefly described.

A solder paste in a through-hole electrode is pushed out by a pin terminal, so that the solder paste is divided into a solder paste in the through-hole electrode and a solder paste attached to a tip end of the pin terminal. At this time, in a case where a large amount of solder paste is filled in such a form that the solder paste protrudes from the bottom end of the through-hole electrode in order to improve bonding reliability of the solder, the solder paste cannot be applied upward to the pin terminal, so that the solder may be cured in a state of being attached to the pin terminal depending on the material of the pin terminal, surface treatment, storage condition of the bonding material, and the like. In such a case, the amount of solder in the solder bond is insufficient, so that it is difficult to improve the bonding reliability. As described above, there has been a problem that it is difficult to stably mount a component on a board having the through-hole electrode with high reliability required by on-vehicle electronic equipment and the like.

Figure 1:
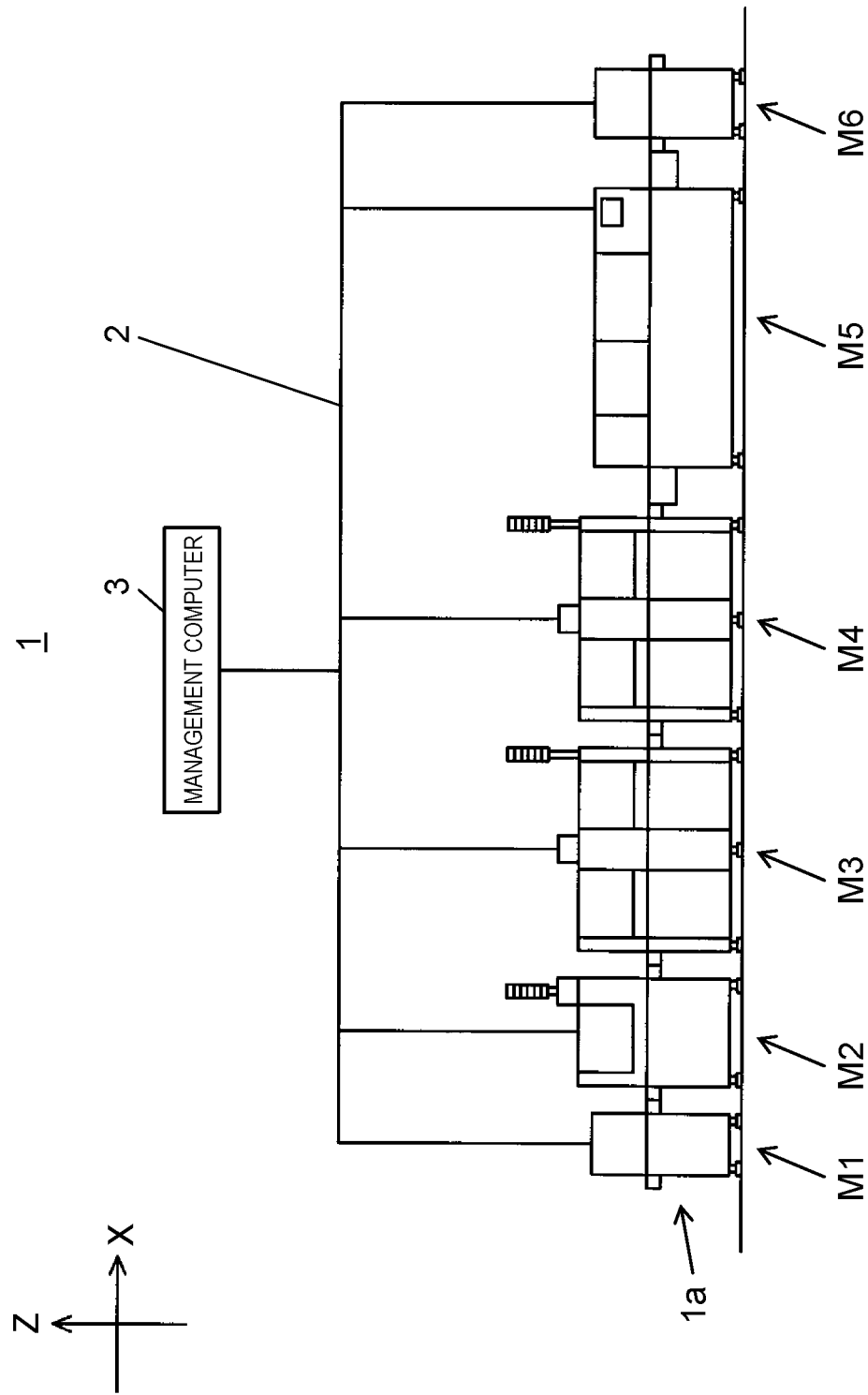
FIG. 1 is a configurational explanatory diagram of a component mounting system of an exemplary embodiment of the disclosure.

Next, the exemplary embodiments of the disclosure will be described with reference to drawings. First, the configuration of component mounting system 1 will be described with reference to FIG. 1. Component mounting system 1 has a function of manufacturing a component mounting board by mounting a component on a board. In the present exemplary embodiment, the component mounting board is manufactured by mounting a component having a pin terminal (hereinafter, simply referred to as "pin") for connection on the board having the through-hole electrode.

Component mounting system 1 mainly includes component mounting line 1a configured by connecting board supplier M1, screen printer M2, first component mounter M3, second component mounter M4, reflow device M5, and board collector M6 in series in a board transport direction (X direction). The respective devices of board supplier M1 to board collector M6 are connected to management computer 3 via communication network 2.

Each of these devices is connected by a board transport mechanism, and board 4 supplied by board supplier M1 (see FIGS. 2 to 4) is sequentially passed along component mounting line 1a from the upstream side to the downstream side. That is, board 4 is first carried into screen printer M2. Here, a solder paste for component bonding is printed on board 4 having a through-hole.

Board 4 on which the solder paste is printed is sequentially passed to first component mounter M3 and second component mounter M4, and component mounting operation for mounting a component is executed with respect to board 4 on which the solder paste is printed. In the present exemplary embodiment, the component to be mounted includes surface mount component 5 such as a chip component and pin connecting component 6 provided with pin 6a for connecting such as a connector component (see FIGS. 10A to 10D and 11A to 11D). First, surface mount component 5 is mounted by first component mounter M3, and then, pin connecting component 6 is mounted by second component mounter M4.

Board 4 on which these components are mounted is carried into reflow device M5, and reflow is performed collectively here. That is, by heating board 4 according to a predetermined heating profile, the solder component in the solder paste is melted and solidified. Surface mount component 5 and pin connecting component 6 are collectively solder bonded to board 4, and the component mounting board in which these components are mounted on board 4 is completed. The completed component mounting board is collected by board collector M6.

Figure 2:
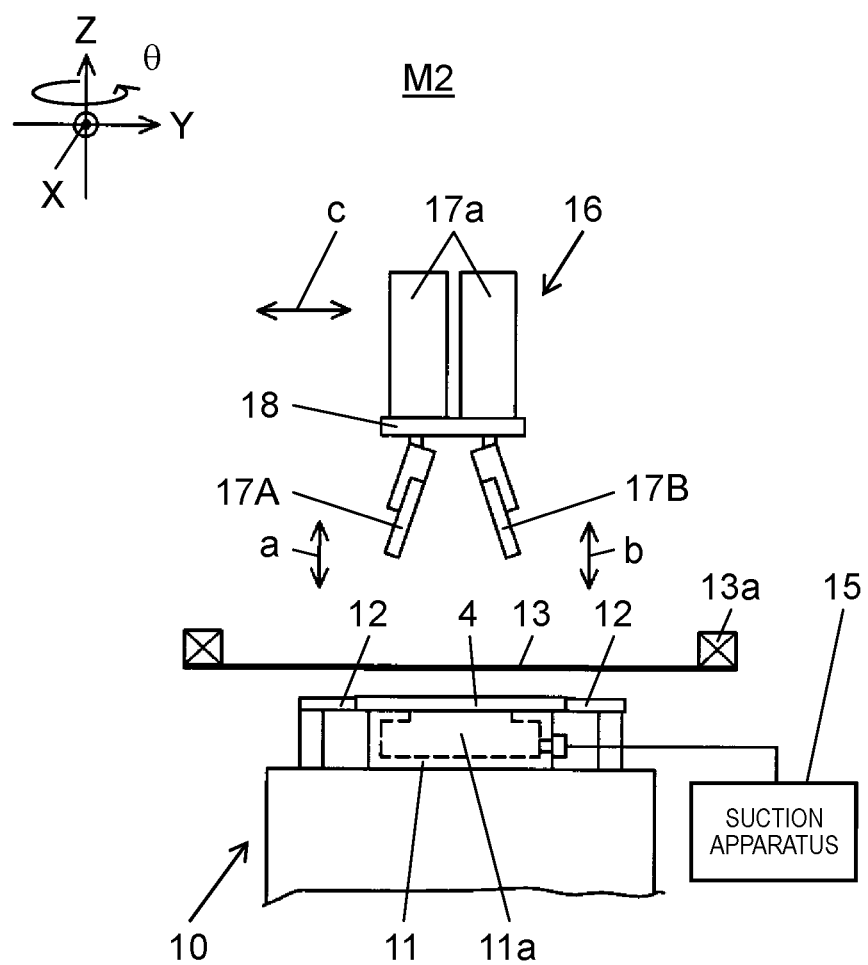
FIG. 2 is a functional explanatory diagram of a screen printer in the component mounting system of an exemplary embodiment of the disclosure.

Next, the function of screen printer M2 will be described with reference to FIG. 2. In FIG. 2, screen printer M2 is provided with board positioner 10 which holds and positions carried-in board 4. Board positioner 10 includes a positioning table movable in the X direction, a Y direction, a Z direction, and a θ direction which is a rotation direction around a Z-axis. Board supporter 11 which supports board 4 from the bottom surface is provided on an upper surface of board positioner 10. Board 4 supported from the bottom side thereof by board supporter 11 is clamped from both sides by clamping mechanisms 12 and the position thereof is fixed.

Suction space 11a having an open upper surface is formed in the inside of board supporter 11. Board supporter 11 is also connected to suction apparatus 15. The air in suction space 11a is sucked by operating suction apparatus 15. Here, board 4 is disposed so as to cover the upper surface of board supporter 11. Accordingly, suction apparatus 15 can suck the air in suction space 11a from the bottom surface side of board 4 supported by board supporter 11 from the bottom side thereof. In the present exemplary embodiment, in the process of screen printing, the suction is performed from the bottom surface side of board 4 so as to promote the filling of solder paste 9 into inner holes 8b of through-hole electrodes 8 formed on board 4 (see FIGS. 8A to 8C).

Screen mask 13 extended to mask holder 13a is disposed above board positioner 10. First pattern holes 14b and second pattern holes 14a are formed in screen mask 13 (see FIG. 7A). First pattern holes 14b and second pattern holes 14a correspond to through-hole electrodes 8 and surface mount electrodes 7 provided corresponding to pin connecting components 6 and surface mount components 5 respectively on board 4 to be printed. Board 4 abuts against the bottom surface of screen mask 13 by moving board positioner 10 upward in a state where board 4 is supported by board supporter 11 from the bottom side thereof.

Squeegee unit 16 including squeegees 17A and 17B are disposed above screen mask 13. Squeegee unit 16 includes squeegee lifting mechanisms 17a provided on an upper surface of moving plate 18 corresponding to each of squeegees 17A and 17B. Squeegees 17A and 17B are moved upward and downward individually by driving squeegee lifting mechanisms 17a (arrows a and b). Moving plate 18 is reciprocatable (arrow c) in a squeegeeing operation direction (Y direction) by a squeegee moving mechanism (not shown).

By moving moving plate 18 in the squeegeeing operation direction in a state where either squeegee 17A or 17B is moved downward with respect to screen mask 13, squeegees 17A and 17B fill first pattern holes 14b and second pattern holes 14a formed in screen mask 13 with solder paste 9 supplied on an upper surface of screen mask 13. In this state, plate separation of moving board 4 downward to be separated from the bottom surface of screen mask 13 is performed, so that solder paste 9 filled in first pattern holes 14b and second pattern holes 14a is supplied to through-hole electrodes 8 and surface mount electrodes 7 by printing. That is, screen printer M2 prints solder paste 9 on through-hole electrodes 8 through screen mask 13 having first pattern holes 14b which are openings corresponding to through-hole electrodes 8.

Figure 3:
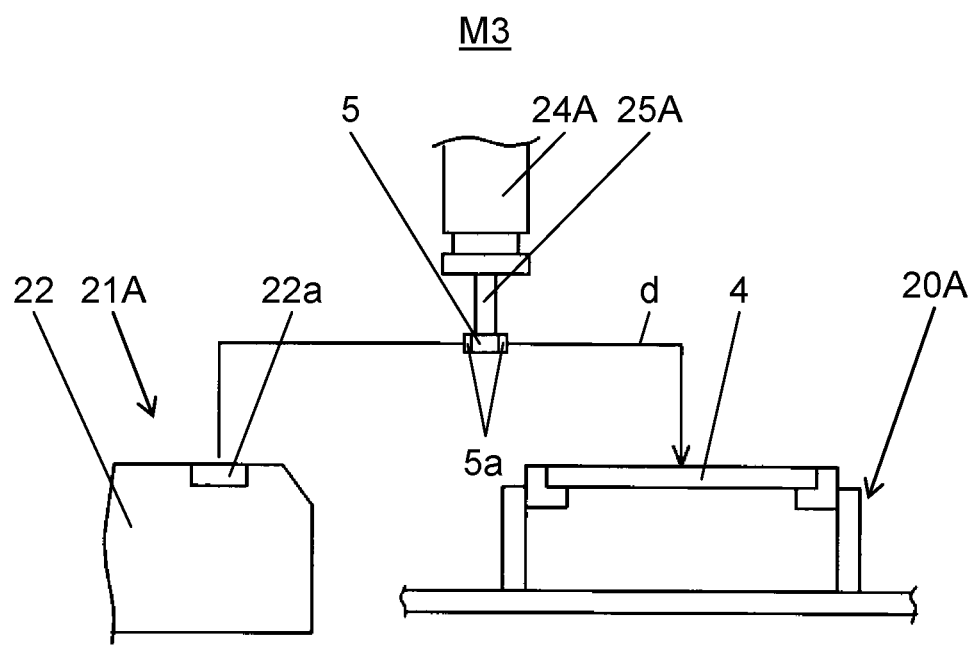
FIG. 3 is a functional explanatory diagram of a component mounter in the component mounting system of an exemplary embodiment of the disclosure.

Next, the function of first component mounter M3 will be described with reference to FIG. 3. As shown in FIG. 3, in first component mounter M3, board transporter 20A which transports and positions board 4 and component supplier 21A which supplies a component to be mounted are disposed. Tape feeder 22 which supplies surface mount component 5 such as a chip component in a taped and stored state to component pick-up position 22a by tape feeding is disposed in component supplier 21A. Surface mount component 5 is a chip type component in which terminals 5a for connection are formed at both ends.

Surface mount component 5 supplied to component pick-up position 22a is held by component holding tool 25A installed on mounting head 24A and picked up from tape feeder 22. By moving mounting head 24A which holds surface mount component 5 above board 4 and causing component placement operation to be performed on a component mounting position (arrow d), surface mount component 5 is placed at the component mounting position for a surface mount component set on board 4 (see FIG. 10A).

Figure 4:
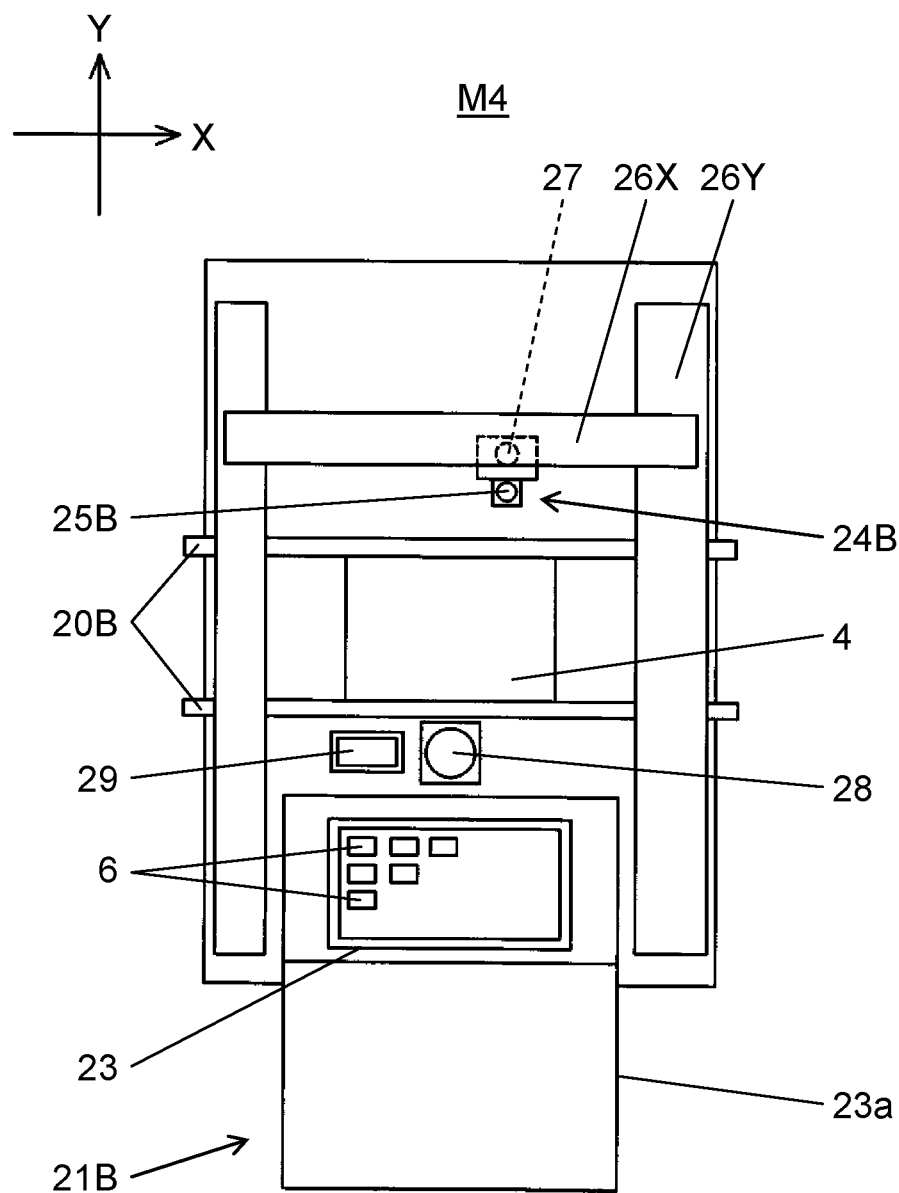
FIG. 4 is a configurational explanatory diagram of a component mounter in a component mounting system of an exemplary embodiment of the disclosure.

Next, the configuration of second component mounter M4 will be described with reference to FIG. 4. In FIG. 4, board transporters 20B which transport and position board 4 and component supplier 21B which supplies a component to be mounted are disposed in second component mounter M4. Component tray 23 which stores pin connecting components 6 is held by tray feeder 23a and disposed in component supplier 21B. Pin connecting components 6 are stored in a regular array in component tray 23. Pin connecting component 6 is a connector component in which a plurality of pins 6a for connection are formed on the bottom surface.

Second component mounter M4 includes a head moving mechanism formed of Y-axis movement table 26Y and X-axis movement table 26X. Mounting head 24B including component holding tool 25B and board recognition camera 27 are installed on X-axis movement table 26X. Mounting head 24B moves between component supplier 21B and board 4 positioned by board transporter 20B by driving the head moving mechanism. By this movement of mounting head 24B, pin connecting component 6 is held by component holding tool 25B and picked up from component tray 23.

Component recognition camera 28 and flux tank 29 are disposed between board transporters 20B and component supplier 21B. In the process of moving component supplier 21B holding pin connecting component 6 above board 4, the positions of pins 6a of pin connecting component 6 in the state held by component holding tool 25B are recognized by positioning component supplier 21B above component recognition camera 28.

Figure 5A:
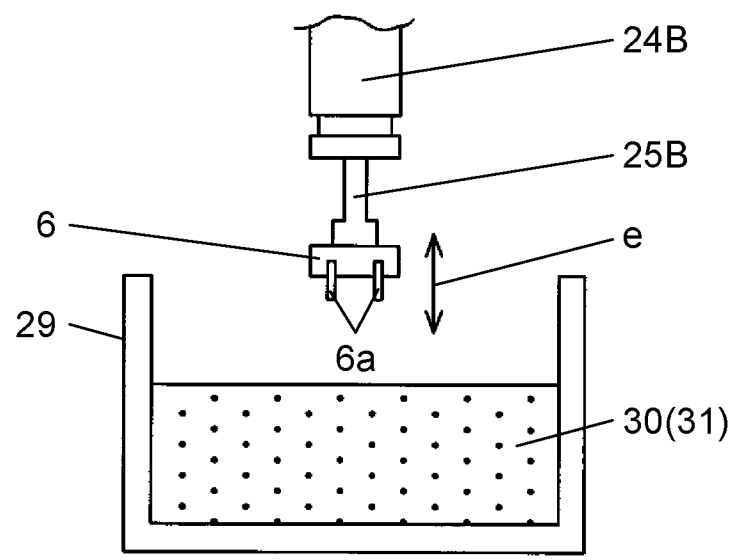
FIG. 5A is a functional explanatory diagram of a component mounter in a component mounting system of an exemplary embodiment of the disclosure.

Flux tank 29 has a function of storing flux 31 to be transferred onto pins 6a of pin connecting component 6. In the present exemplary embodiment, sponge 30 which is a porous material impregnated with flux 31 is stored in flux tank 29 as shown in FIG. 5A. That is, here, flux tank 29 is designed to store flux 31 in a form impregnated in sponge 30.

In order to transfer flux 31 onto pins 6a, first, mounting head 24B which suction holds pin connecting component 6 by component holding tool 25B is moved above flux tank 29. Component holding tool 25B is moved upward and downward (arrow e) to insert pins 6a into sponge 30 impregnated with flux 31 in flux tank 29 and immerse in flux 31.

Figure 5B:
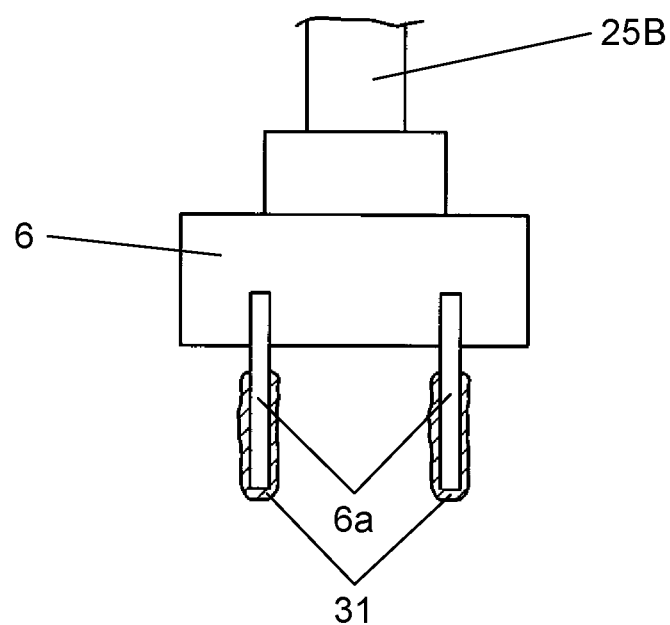
FIG. 5B is a functional explanatory diagram of a component mounter in a component mounting system of an exemplary embodiment of the disclosure.

Accordingly, flux 31 is transferred onto the portion of an outer peripheral surface of pins 6a immersed in flux 31 in a film shape as shown in FIG. 5B. As described above, flux 31 transferred onto pins 6a has an action of causing solder paste 9 attached to bottom ends of pins 6a in a divided state (see tip end attachment paste 9d shown in FIG. 11A) to be applied upward along pins 6a in the reflow process of bonding pins 6a to through-hole electrodes 8 by solder paste 9 (see FIGS. 11A to 11D).

Figure 6A:
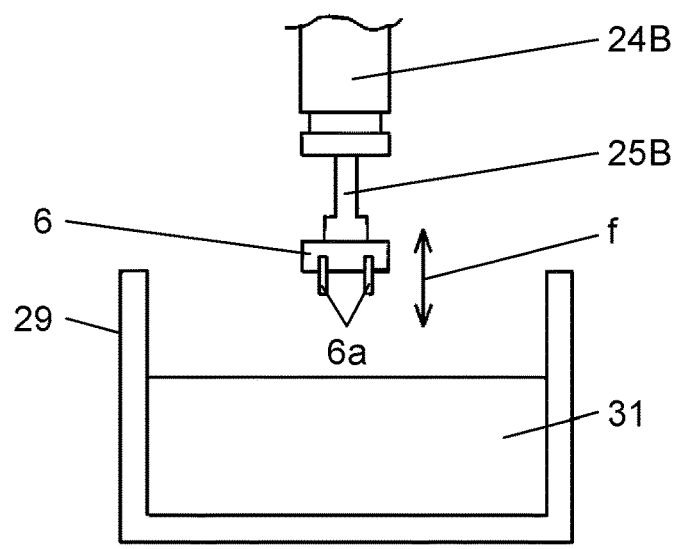
FIG. 6A is a functional explanatory diagram of a component mounter in a component mounting system of an exemplary embodiment of the disclosure.

In the example shown in FIGS. 5A and 5B, an example in which flux 31 is impregnated and stored in sponge 30 is shown. However, as shown in FIG. 6A, a liquid of flux 31 may be stored in flux tank 29. When flux 31 is applied to pins 6a, mounting head 24B which suction holds pin connecting component 6 by component holding tool 25B is moved above flux tank 29 in this case as well. Component holding tool 25B is moved upward and downward (arrow f) to immerse pins 6a in flux tank 29, and pull up pins 6a from flux tank 29.

Figure 6B:
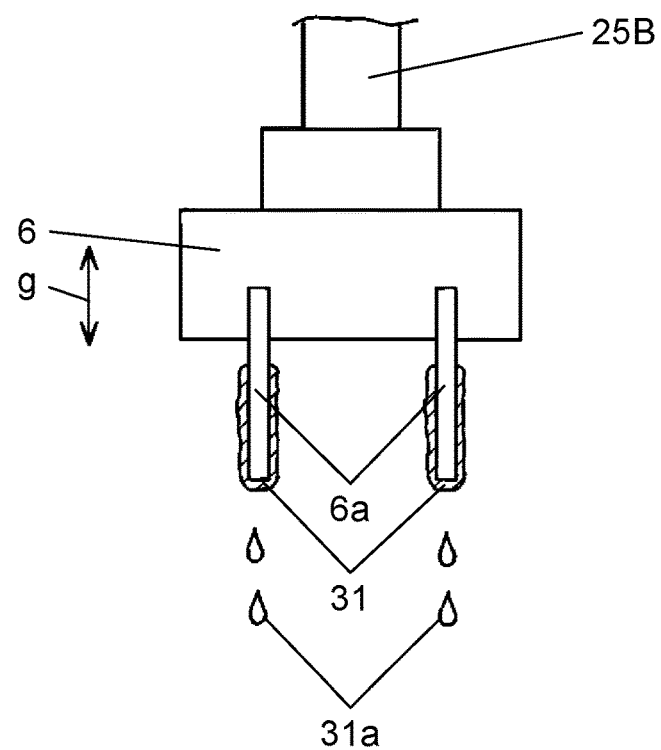
FIG. 6B is a functional explanatory diagram of a component mounter in a component mounting system of an exemplary embodiment of the disclosure.

Next, as shown in FIG. 6B, excessive flux 31 attached to pins 6a is dropped and removed in the form of droplets 31a by moving pin connecting component 6 upward and downward (arrow g). Accordingly, as in the example shown in FIGS. 5A and 5B, flux 31 is transferred onto the portion of the outer periphery of pins 6a immersed in flux 31 in a film shape. In this way, pin connecting component 6 onto which flux 31 is transferred is held by mounting head 24B and placed at the component mounting position for a connector component set on board 4.

As described above, mounting head 24B included in second component mounter M4 shown in the present exemplary embodiment transfers flux 31 onto pins 6a by immersing pins 6a in flux tank 29. Mounting head 24B has a function of inserting pins 6a onto which flux 31 is transferred into through-hole electrodes 8 on which solder paste 9 is printed.

Next, the component mounting method executed by the above-described component mounting system 1 will be described with reference to FIGS. 7A to 11D. In the component mounting method, the component mounting board is manufactured by mounting pin connecting component 6 having pins 6a on board 4 having through-hole electrodes 8. Specifically, the above-described component mounting method is composed of following operational processes.

That is, first, solder paste 9 is printed on through-hole electrodes 8 through screen mask 13 having first pattern holes 14b which are openings corresponding to through-hole electrodes 8 (printing process). Next, flux 31 is transferred onto pins 6a by holding pin connecting component 6 and immersing pins 6a in flux tank 29 filled with flux 31 (transfer process). Pins 6a onto which flux 31 is transferred are inserted into through-hole electrodes 8 onto which solder paste 9 is printed to mount pin connecting component 6 on board 4 (mounting process). By heating board 4 on which pin connecting component 6 is mounted, the solder in solder paste 9 is melted and solidified, and the component is solder bonded to the board (reflow process).

Figure 7A:
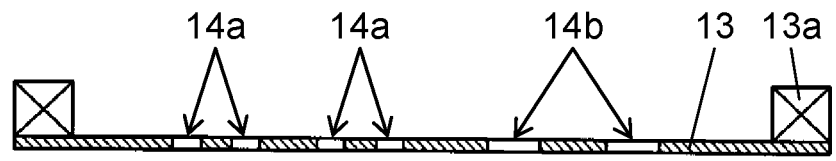
FIG. 7A is a process explanatory diagram of a component mounting method according to the component mounting system of an exemplary embodiment of the disclosure.
Figure 7B:
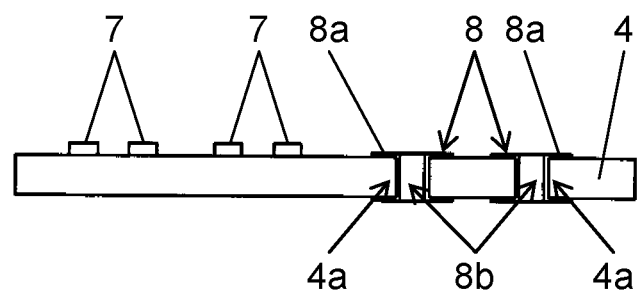
FIG. 7B is a process explanatory diagram of the component mounting method in the component mounting system of an exemplary embodiment of the disclosure.

First, the printing process in the above-described component mounting method will be described with reference to FIGS. 7A to 7C, 8A to 8C, and 9A to 9C. FIG. 7A shows screen mask 13 installed on screen printer M2 shown in FIG. 2. The periphery of screen mask 13 is held by mask holder 13a. First pattern holes 14b and second pattern holes 14a are formed in screen mask 13. First pattern holes 14b and second pattern holes 14a correspond to through-hole electrodes 8 and surface mount electrodes 7 formed on board 4 shown in FIG. 7B, respectively.

Through-hole electrodes 8 are electrodes provided in through-holes 4a formed through board 4. Surface mount electrodes 7 are electrodes for surface mount components such as a chip component. Lands 8a which cover a predetermined range around through-holes 4a on an upper surface of board 4 and inner holes 8b which vertically penetrate the inside of through-holes 4a are provided in through-hole electrodes 8.

Figure 7C:
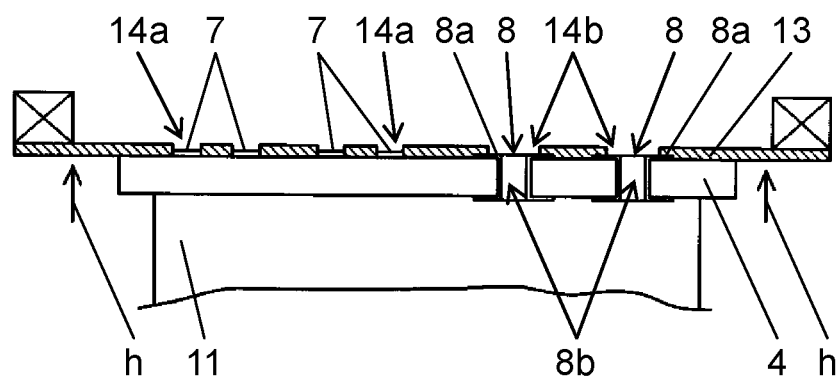
FIG. 7C is a process explanatory diagram of the component mounting method in the component mounting system of an exemplary embodiment of the disclosure.

When performing screen printing, first, as shown in FIG. 7C, board 4 having a bottom surface supported by board supporter 11 from downward is moved upward with respect to screen mask 13 (arrow h), so that board 4 abuts against screen mask 13 in which first pattern holes 14b and second pattern holes 14a are provided from the bottom surface side. Accordingly, lands 8a and inner holes 8b in through-hole electrodes 8 are positioned with respect to first pattern holes 14b, and surface mount electrodes 7 are aligned with respect to second pattern holes 14a.

Here, an area of first pattern hole 14b corresponding to through-hole electrode 8 is set to be larger than the area of inner hole 8b of through-hole electrode 8. Accordingly, in the printing operation described below, it is possible to reliably fill inner holes 8b with solder paste 9 pushed in from first pattern holes 14b.

Figure 8A:
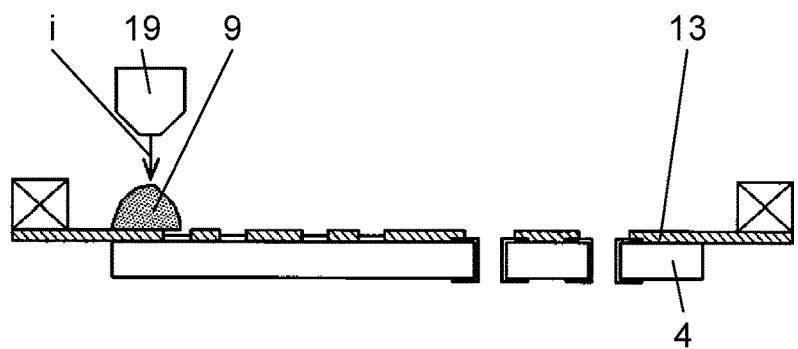
FIG. 8A is a process explanatory diagram of the component mounting method according to the component mounting system of an exemplary embodiment of the disclosure.
Figure 8B:
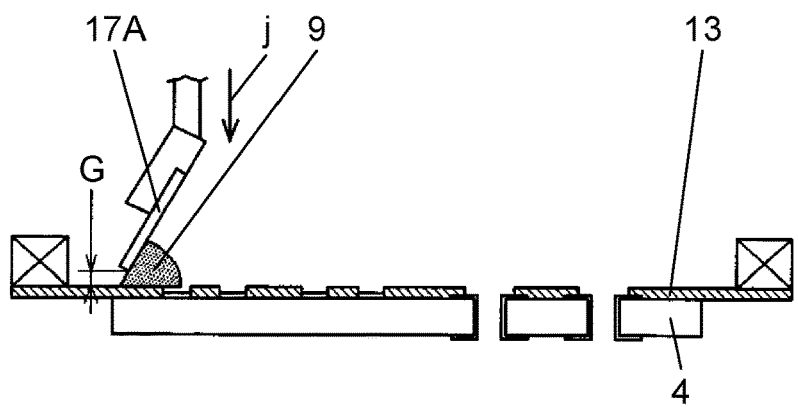
FIG. 8B is a process explanatory diagram of the component mounting method according to the component mounting system of an exemplary embodiment of the disclosure.

Next, solder paste 9 is discharged by print head 19 positioned at an end of board 4 above screen mask 13, and solder paste 9 is supplied on screen mask 13 as shown in FIG. 8A (arrow i). Thereafter, forward printing is executed by squeegee 17A, and as shown in FIG. 8B, squeegee 17A is moved downward to a position in which predetermined interval G is formed between the bottom end and the upper surface of screen mask 13 (arrow j).

Figure 8C:
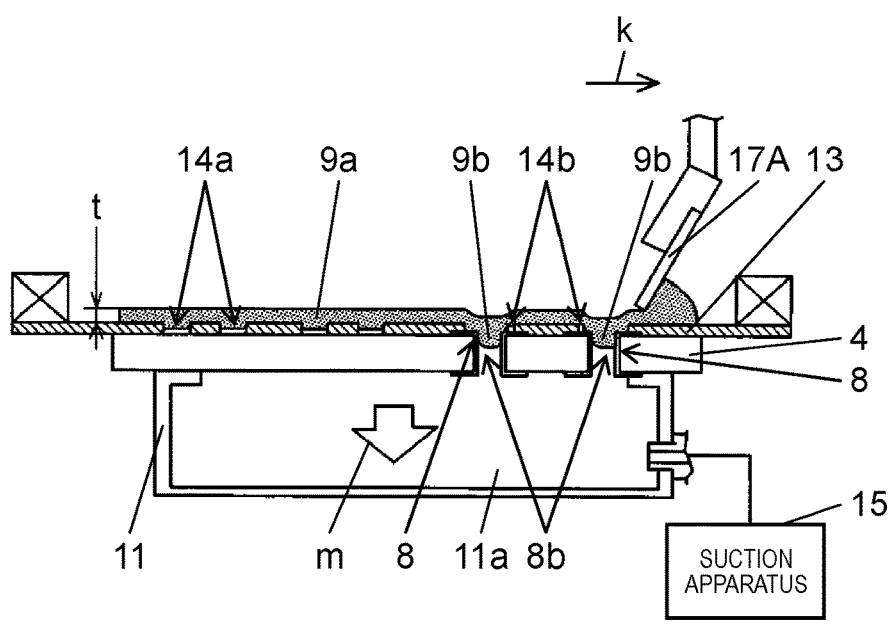
FIG. 8C is a process explanatory diagram of the component mounting method according to the component mounting system of an exemplary embodiment of the disclosure.

In this state, as shown in FIG. 8C, squeegee 17A is moved in a first direction (arrow k direction) which is a forward direction. Accordingly, paste layer 9a in which solder paste 9 is spread is formed with having thickness t corresponding to predetermined interval G on the upper surface of screen mask 13. Along with this, solder paste 9 is pushed into second pattern holes 14a and first pattern holes 14b.

Accordingly, a layer of solder paste 9 is formed on upper surfaces of through-hole electrodes 8 which are the first electrodes in first pattern holes 14b. That is, in the above-described forward printing, squeegee 17A is positioned above screen mask 13 with predetermined interval G therebetween, and squeegee 17A is moved in the first direction to form the layer of solder paste 9 on the upper surfaces of through-hole electrodes 8 through first pattern holes 14b.

During the forward printing in which squeegee 17A is moved in the first direction to form the layer of solder paste 9 on the upper surfaces of through-hole electrodes 8, the air inside suction space 11a is sucked by suction apparatus 15 from the bottom surface of board 4 (arrow m). Accordingly, the air inside inner holes 8b is sucked from the bottom surface side, and solder paste 9 positioned on the upper surfaces of through-hole electrodes 8 is drawn into inner holes 8b to become paste drawers 9b. At this time, recesses in which surfaces are recessed are formed as paste drawers 9b are drawn into inner holes 8b at a portion on paste layer 9a positioned above through-hole electrodes 8.

Figure 9A:
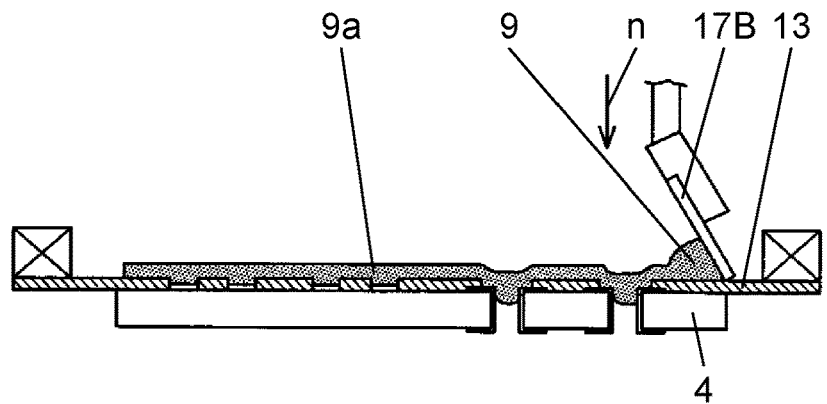
FIG. 9A is a process explanatory diagram of the component mounting method according to the component mounting system of an exemplary embodiment of the disclosure.
Figure 9B:
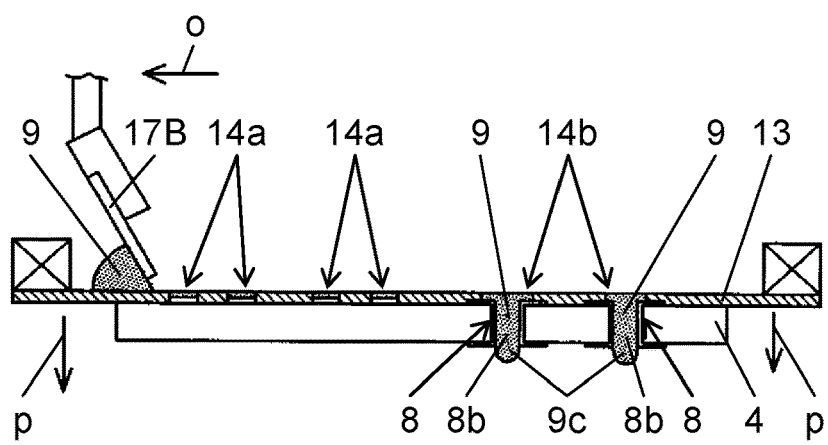
FIG. 9B is a process explanatory diagram of the component mounting method according to the component mounting system of an exemplary embodiment of the disclosure.

Next, the backward printing by squeegee 17B is executed. That is, after moving squeegee 17A of which the forward printing is finished, upward, squeegee 17B is moved downward (arrow n), so that the bottom end abuts against the upper surface of screen mask 13 as shown in FIG. 9A. In this state, as shown in FIG. 9B, squeegee 17B is moved in a backward direction which is a second direction different from the first direction (arrow o).

Accordingly, in the forward printing, paste layer 9a formed on the upper surface of screen mask 13 is scraped off by the movement of squeegee 17B. Along with this, solder paste 9 is pushed into first pattern holes 14b by the squeegeeing operation in which squeegee 17B moves, and solder paste 9 is filled into inner holes 8b of through-hole electrodes 8. In the backward printing, when squeegee 17B operates in the second direction, solder paste 9 is printed on surface mount electrodes 7 which are second electrodes through second pattern holes 14a.

At this time, since paste drawers 9b drawn by the forward printing are already present in inner holes 8b of through-hole electrodes 8, inner holes 8b are filled with solder paste 9 as solder paste 9 is newly pushed in by the backward printing. At this time, a sufficient amount of solder paste 9 is pushed in through first pattern holes 14b, so that paste protrusions 9c protruding from the bottom surface of board 4 are formed at the bottom ends of inner holes 8b.

Figure 9C:
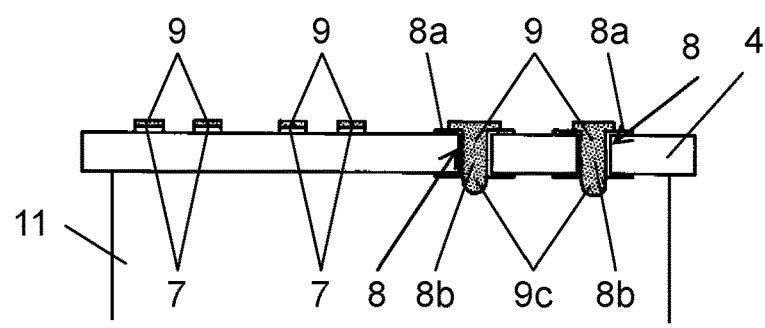
FIG. 9C is a process explanatory diagram of the component mounting method according to the component mounting system of an exemplary embodiment of the disclosure.

Thereafter, the plate separation is performed. That is, by moving board supporter 11 which supports board 4 from the bottom side thereof, downward, board 4 is separated from the bottom surface of screen mask 13 (arrow p). Accordingly, as shown in FIG. 9C, solder paste 9 for solder bonding is supplied on board 4 by the screen printing. In board 4 after the screen printing, solder paste 9 is supplied on upper surfaces of surface mount electrodes 7 with a film thickness according to the thickness of screen mask 13. In through-hole electrodes 8, solder paste 9 is supplied so as to cover an upper surface of lands 8a and fill in inner holes 8b. At the bottom ends of inner holes 8b, paste protrusions 9c in which solder paste 9 protrudes downward from the bottom surface of board 4 are formed.

Next, with reference to FIGS. 10A to 10D and 11A to 11D, in the mounting process in the above-described component mounting method, that is, the component mounting method for mounting pin connecting component 6 in which pins 6a for connection is provided on board 4 having through-hole electrodes 8 provided in through-holes 4a will be described. Here, the operation described below is executed on board 4 as a target on which solder paste 9 is printed by screen printer M2 and is in the state shown in FIG. 9C. In the examples shown here, an example is shown in which surface mount component 5 is included as a mounting target together with pin connecting component 6 provided with pins 6a for connection.

Figure 10A:
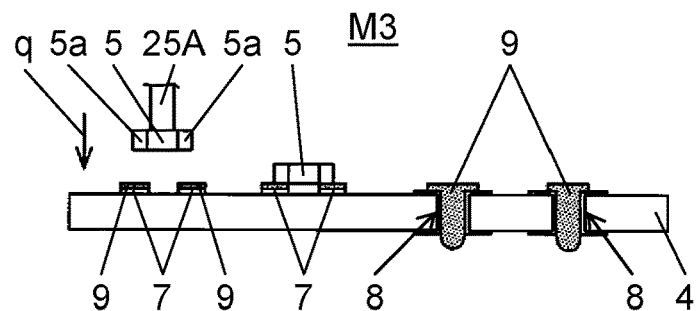
FIG. 10A is a process explanatory diagram of the component mounting method according to the component mounting system of an exemplary embodiment of the disclosure.

Board 4 on which solder paste 9 is printed is carried in first component mounter M3 (see FIG. 3), and as shown in FIG. 10A, the mounting of surface mount component 5 on board 4 is executed. Here, surface mount component 5 is held by component holding tool 25A installed on mounting head 24A, and surface mount components 5 are aligned with respect to surface mount electrodes 7 formed on the upper surface of board 4. That is, terminals 5a at both ends of surface mount component 5 are aligned with solder paste 9 supplied to surface mount electrodes 7 and surface mount components 5 are moved downward (arrow q), so that terminals 5a are landed on solder paste 9.

Figure 10B:
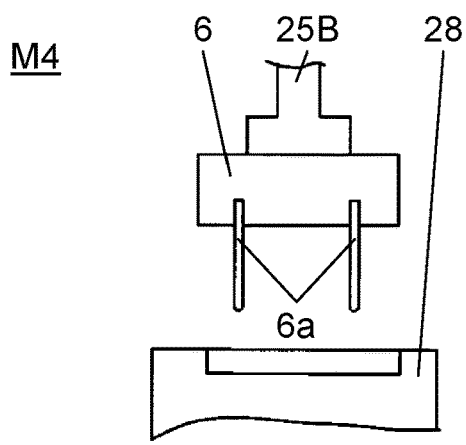
FIG. 10B is a process explanatory diagram of the component mounting method according to the component mounting system of an exemplary embodiment of the disclosure.
Figure 10C:
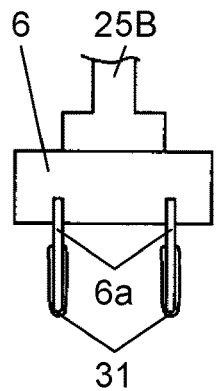
FIG. 10C is a process explanatory diagram of the component mounting method according to the component mounting system of an exemplary embodiment of the disclosure.

Thereafter, board 4 is carried into second component mounter M4 (see FIG. 4). Here, first, as shown in FIG. 10B, component holding tool 25B holding pin connecting component 6 is positioned above component recognition camera 28, and pins 6a are imaged and recognized from below. Next, after the position of pins 6a are recognized, the transfer of flux 31 onto pins 6a described in FIGS. 4, 5A, and 5B is performed. Accordingly, as shown in FIG. 10C, the film of flux 31 is formed in a predetermined range including the bottom ends in pins 6a. Prior to the transfer of flux 31, the position recognition of pins 6a by component recognition camera 28 is executed, so that it is possible to prevent the deterioration of the position detection accuracy of pins 6a due to the attachment of flux 31.

Figure 10D:
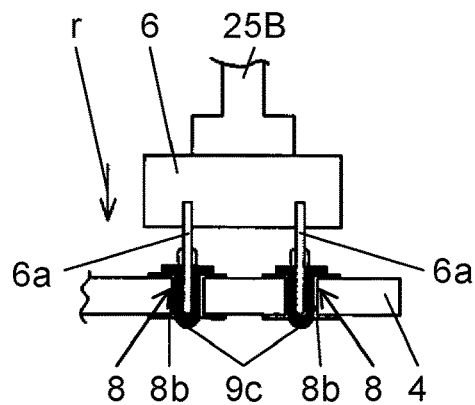
FIG. 10D is a process explanatory diagram of the component mounting method according to the component mounting system of an exemplary embodiment of the disclosure.
Figure 11A:
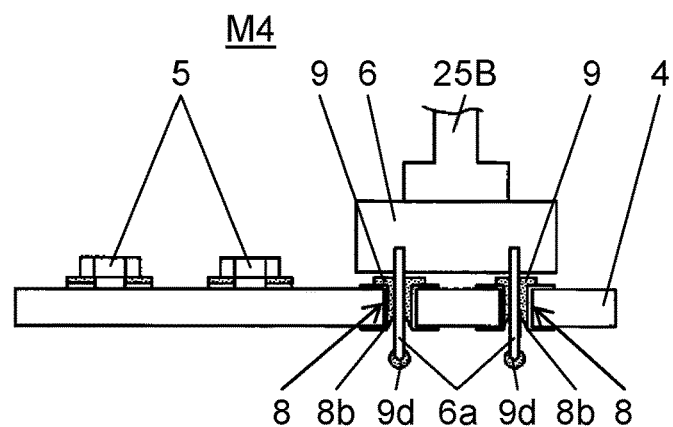
FIG. 11A is a process explanatory diagram of the component mounting method according to the component mounting system of an exemplary embodiment of the disclosure.

Next, pin connecting component 6 to which flux 31 is transferred onto pins 6a is mounted on board 4. That is, as shown in FIG. 10D, pin connecting component 6 is positioned and moved downward with respect to through-hole electrodes 8 formed on board 4 (arrow r), and pins 6a are inserted into inner holes 8b of through-hole electrodes 8. At this time, based on the position recognition result of pins 6a shown in FIG. 10B, pins 6a are aligned with inner holes 8b. Thereafter, as shown in FIG. 11A, finally, by moving pins 6a downward to a predetermined mount height position, the component mounting operation targeting pin connecting component 6 is completed.

Like the above-described component mounting operation, a portion of solder paste 9 in inner holes 8b is pushed out by the tip ends of pins 6a in the pin inserting operation of inserting pins 6a into inner holes 8b filled with solder paste 9. Accordingly, solder paste 9 printed integrally on through-hole electrodes 8 is in a state in which a substantially ball-shaped tip end attachment paste 9d attached to the tip ends of pins 6a and solder paste 9 remaining in inner holes 8b are separated.

Figure 11B:
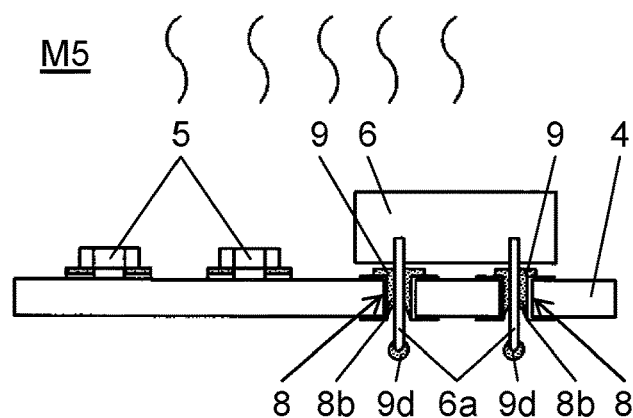
FIG. 11B is a process explanatory diagram of the component mounting method according to the component mounting system of an exemplary embodiment of the disclosure.

Board 4 on which the mounting of surface mount component 5 and pin connecting component 6 is finished as described above is sent to reflow device M5, where the reflow process is executed. In the present exemplary embodiment, board 4 is sent to the reflow process in the state described above, and is heated according to the predetermined heating profile. That is, the heating in reflow device M5 is, as shown in FIG. 11B, performed in a state in which tip end attachment paste 9d attached to the tip ends of pins 6a and solder paste 9 remaining in inner holes 8b are separated.

Figure 11C:
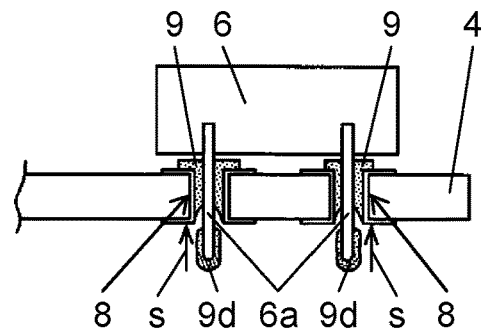
FIG. 11C is a process explanatory diagram of the component mounting method according to the component mounting system of an exemplary embodiment of the disclosure.

At this time, in the predetermined range including the bottom ends of pins 6a (see FIG. 10C), the film of flux 31 is formed in advance, and the solder wettability is good. Accordingly, the molten solder in which tip end attachment paste 9d is melted by the heating is, as shown in FIG. 11C, applied upward along the outer peripheral surfaces of pins 6a (arrow s). The wet molten solder is brought into contact with the molten solder in which the solder component of solder paste 9 in inner holes 8b is melted to be integrated. Accordingly, solder bonds 9x filling inner holes 8b is formed.

Figure 11D:
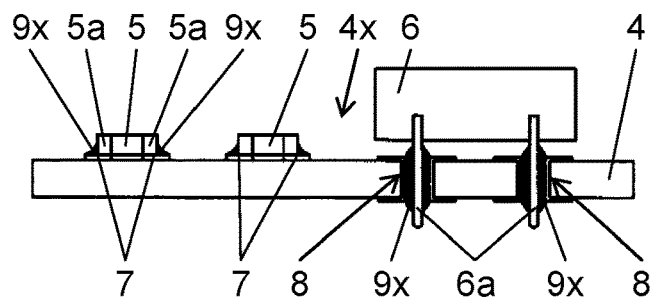
FIG. 11D is a process explanatory diagram of the component mounting method according to the component mounting system of an exemplary embodiment of the disclosure.

In the reflow process, as shown in FIG. 11D, terminals 5a of surface mount component 5 are solder bonded to surface mount electrodes 7 via solder fillet-shaped solder bonds 9x. Along with this, pins 6a of pin connecting component 6 are solder bonded to through-hole electrodes 8 via solder bonds 9x formed as to fill inner holes 8b of through-hole electrodes 8 provided on board 4. As described above, component mounting board 4x on which surface mount component 5 and pin connecting component 6 are mounted on board 4 is completed and is collected by board collector M6.

As described above, in the component mounting method shown in the present exemplary embodiment, in the component mounting in which pin connecting component 6 having pins 6a is mounted on board 4 having through-hole electrodes 8, solder paste 9 is printed on through-hole electrodes 8 through screen mask 13 having first pattern holes 14b corresponding to through-hole electrodes 8, flux 31 is transferred onto pins 6a by holding pin connecting component 6 and immersing pins 6a into flux tank 29 filled with flux 31, and pins 6a onto which flux 31 is transferred is inserted into through-hole electrodes 8 on which solder paste 9 is printed to mount pin connecting component 6 on board 4.

In the component mounting system 1 shown in the present exemplary embodiments, in the component mounting system for mounting pin connecting component 6 having pins 6a on board 4 having through-hole electrodes 8, the system including screen printer M2 that prints solder paste 9 on through-hole electrodes 8 through screen mask 13 having first pattern holes 14b corresponding to through-hole electrodes 8 and second component mounter M4 that has mounting head 24B which holds and mounts pin connecting component 6 on board 4 and flux tank 29 which is filled with flux 31, in which mounting head 24B transfers flux 31 onto pins 6a by immersing pins 6a in flux tank 29, and inserts pins 6a onto which flux 31 is transferred into through-hole electrodes 8 on which solder paste 9 is printed.

With such a configuration, solder wettability of the outer peripheral surfaces of pins 6a can be improved. Therefore, in the reflow process, solder paste 9 attached to the tip ends of pins 6a and remaining in inner holes 8b and tip end attachment paste 9d in the divided state can be applied up along the outer peripheral surfaces of pins 6a. Accordingly, pin connecting component 6 can be stably mounted on board 4 having through-hole electrodes 8 with high reliability.

The component mounting method and the component mounting system of the disclosure have the effect of being able to stably mount components on a board having through-hole electrodes with high reliability, and it is useful in the field of component mounting targeting boards having through-hole electrodes.

What is claimed is:

1. A component mounting method for mounting a component having a pin terminal on a board having a through-hole electrode, the method comprising:

printing a solder paste on the through-hole electrode through a mask having an opening corresponding to the through-hole electrode;

transferring a flux onto the pin terminal by holding the component and immersing the pin terminal into a flux tank filled with the flux;

mounting the component on the board by inserting the pin terminal onto which the flux is transferred into the through-hole electrode on which the solder paste is printed such that the solder paste is divided into a first portion of the solder paste on a tip end of the pin terminal and a second portion of the solder paste in an inner hole of the through-hole electrode; and heating the board such that the flux on the pin terminal facilitates the integration of the first portion of the solder paste with the second portion of the solder paste.

2. The component mounting method of claim 1, wherein the flux tank is filled with the flux impregnated in a sponge.

3. The component mounting method of claim 1, wherein the flux tank is filled with a liquid of the flux, and wherein, the method further comprises, after the immersing of the pin terminal, pulling up the pin terminal from the flux tank and moving the component up and down.

4. A component mounting system for mounting a component having a pin terminal on a board having a through-hole electrode, the system comprising:

a printer that prints a solder paste on the through-hole electrode through a mask having an opening corresponding to the through-hole electrode;

a component mounter that has a mounting head which holds the component and mounts the component on the board and a flux tank which is filled with a flux, wherein the mounting head transfers the flux onto the pin terminal by immersing the pin terminal in the flux tank, and inserts the pin terminal onto which the flux is transferred into the through-hole electrode on which the solder paste is printed such that the solder paste is divided into a first portion of the solder paste on a tip end of the pin terminal and a second portion of the solder paste in an inner hole of the through-hole electrode; and a reflow device that heats the board such that the flux on the pin terminal facilitates the integration of the first portion of the solder paste with the second portion of the solder paste.

5. The component mounting system of claim 4, wherein the flux tank is filled with the flux impregnated in a sponge.

6. The component mounting system of claim 4, wherein the flux tank is filled with a liquid of the flux, and wherein, after immersing the pin terminal in the flux tank, the mounting head pulls up the pin terminal from the flux tank, and the component is moved up and down.

7. A manufacturing method of a component mounting board for mounting a component having a pin terminal on a board having a through-hole electrode, the method comprising:

printing a solder paste on the through-hole electrode through a mask having an opening corresponding to the through-hole electrode;

transferring a flux onto the pin terminal by holding the component and immersing the pin terminal into a flux tank filled with the flux;

mounting the component on the board by inserting the pin terminal onto which the flux is transferred into the through-hole electrode on which the solder paste is printed such that the solder paste is divided into a first portion of the solder paste on the pin terminal and a second portion of the solder paste in the through-hole electrode; and heating the board such that the flux on the pin terminal facilitates the integration of the first portion of the solder paste with the second portion of the solder paste.

8. The manufacturing method of a component mounting board of claim 7, wherein the flux tank is filled with the flux impregnated in a sponge.

9. The manufacturing method of a component mounting board of claim 7, wherein the flux tank is filled with a liquid of the flux, and wherein, the method further comprises, after the immersing, pulling up the pin terminal from the flux tank and moving the component up and down.

* * * * *